(12) United States Patent
Matsui

(10) Patent No.: US 9,514,572 B2
(45) Date of Patent: Dec. 6, 2016

(54) MIXED REALITY SPACE IMAGE PROVIDING APPARATUS

(71) Applicant: CANON KABUSHIKI KAISHA, Tokyo (JP)

(72) Inventor: Taichi Matsui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 33 days.

(21) Appl. No.: 14/092,690

(22) Filed: Nov. 27, 2013

(65) Prior Publication Data

US 2014/0085298 A1 Mar. 27, 2014

Related U.S. Application Data

(63) Continuation of application No. 12/555,658, filed on Sep. 8, 2009, now Pat. No. 8,643,676.

(30) Foreign Application Priority Data

Sep. 9, 2008 (JP) .................................. 2008-231189

(51) Int. Cl.
| | | |
|---|---|---|
| G06T 19/00 | (2011.01) | |
| G06F 3/01 | (2006.01) | |
| G06T 15/00 | (2011.01) | |
| G06F 17/50 | (2006.01) | |
| G09G 5/00 | (2006.01) | |

(52) U.S. Cl.
CPC ......... *G06T 19/006* (2013.01); *G06F 17/5009* (2013.01); *G06T 19/00* (2013.01); *A63F 2300/8082* (2013.01); *G06F 3/011* (2013.01); *G06F 17/50* (2013.01); *G06T 15/00* (2013.01); *G09G 5/00* (2013.01)

(58) Field of Classification Search
None
See application file for complete search history.

(56) References Cited

U.S. PATENT DOCUMENTS

| | | | | |
|---|---|---|---|---|
| 6,685,566 | B2* | 2/2004 | Ohshima | 463/32 |
| 7,610,558 | B2* | 10/2009 | Morita | 715/757 |
| 8,423,333 | B2* | 4/2013 | Maegawa | G06N 3/006 703/6 |
| 2005/0081180 | A1* | 4/2005 | Kotani | G03F 1/36 716/53 |
| 2006/0161410 | A1* | 7/2006 | Hamatani et al. | 703/13 |
| 2007/0052702 | A1* | 3/2007 | Trotta | G06F 17/5004 345/419 |

* cited by examiner

*Primary Examiner* — Jwalant Amin
(74) *Attorney, Agent, or Firm* — Canon U.S.A., Inc. IP Division

(57) ABSTRACT

A mixed reality space image providing apparatus configured to provide a user with a mixed reality space image in which a virtual object image is superimposed on a real space image is provided includes a selection unit configured to select simulation processing from among a plurality of types of simulation processing based on an instruction from the user, a simulation processing unit configured to perform the simulation processing selected by the selection unit with respect to the virtual object image, and a providing unit configured to generate a mixed reality space image by superimposing the simulation-processed virtual object image on the real space image and to provide the generated mixed reality space image to the user.

14 Claims, 8 Drawing Sheets

MIXED REALITY SPACE IMAGE PROVIDING APPARATUS

CROSS REFERENCE OF RELATED APPLICATIONS

This application is a Continuation of U.S. patent application Ser. No. 12/555,658 filed on Sep. 8, 2009 which claims the benefit of Japanese Patent Application No. 2008-231189 filed Sep. 9, 2008, which is hereby incorporated by reference herein in its entirety.

BACKGROUND OF THE INVENTION

Field of the Invention

The present invention relates to a mixed reality space image providing apparatus, which provides users with a mixed reality space image made of a combination of computer graphics and a real space image.

Description of the Related Art

Conventionally, a three-dimensional computer-aided design (CAD) system has been used in the field of a mechanical design. In this field, a design can be made while a mechanism and components of the mechanism are displayed in three dimensions.

This type of system has, for example, a function to simulate a movement of each of the components before actually assembling the mechanism, in order to assist development of a control program for controlling active components such as an actuator and a motor, and a sensor. Such a three-dimensional CAD system for simulation is discussed in Japanese Patent Application Laid-open No. 2006-195971.

However, in the CAD system as discussed in Japanese Patent Application Laid-open No. 2006-195971, it is difficult to input parameters in much the same way the users actually use the CAD system since the parameters are input via a two-dimensional graphical user interface (GUI). Further, as to a display of the resulting three-dimensional computer graphics, it is sometimes unsatisfactory to feel a simulation result with the two-dimensional display.

SUMMARY OF THE INVENTION

The present invention is directed to an apparatus and a method for providing a mixed reality space image facilitating the sensuous recognition of a simulation result.

According to an aspect of the present invention, a mixed reality space image providing apparatus configured to provide a user with a mixed reality space image in which a virtual object image is superimposed on a real space image is provided. The mixed reality space image providing apparatus includes a selection unit configured to select simulation processing from among a plurality of types of simulation processing based on an instruction from the user, a simulating processing unit configured to perform the simulation processing selected by the selection unit with respect to the virtual object image, and a providing unit configured to generate a mixed reality space image by superimposing the simulation-processed virtual object image on the real space image and to provide the generated mixed reality space image to the user.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
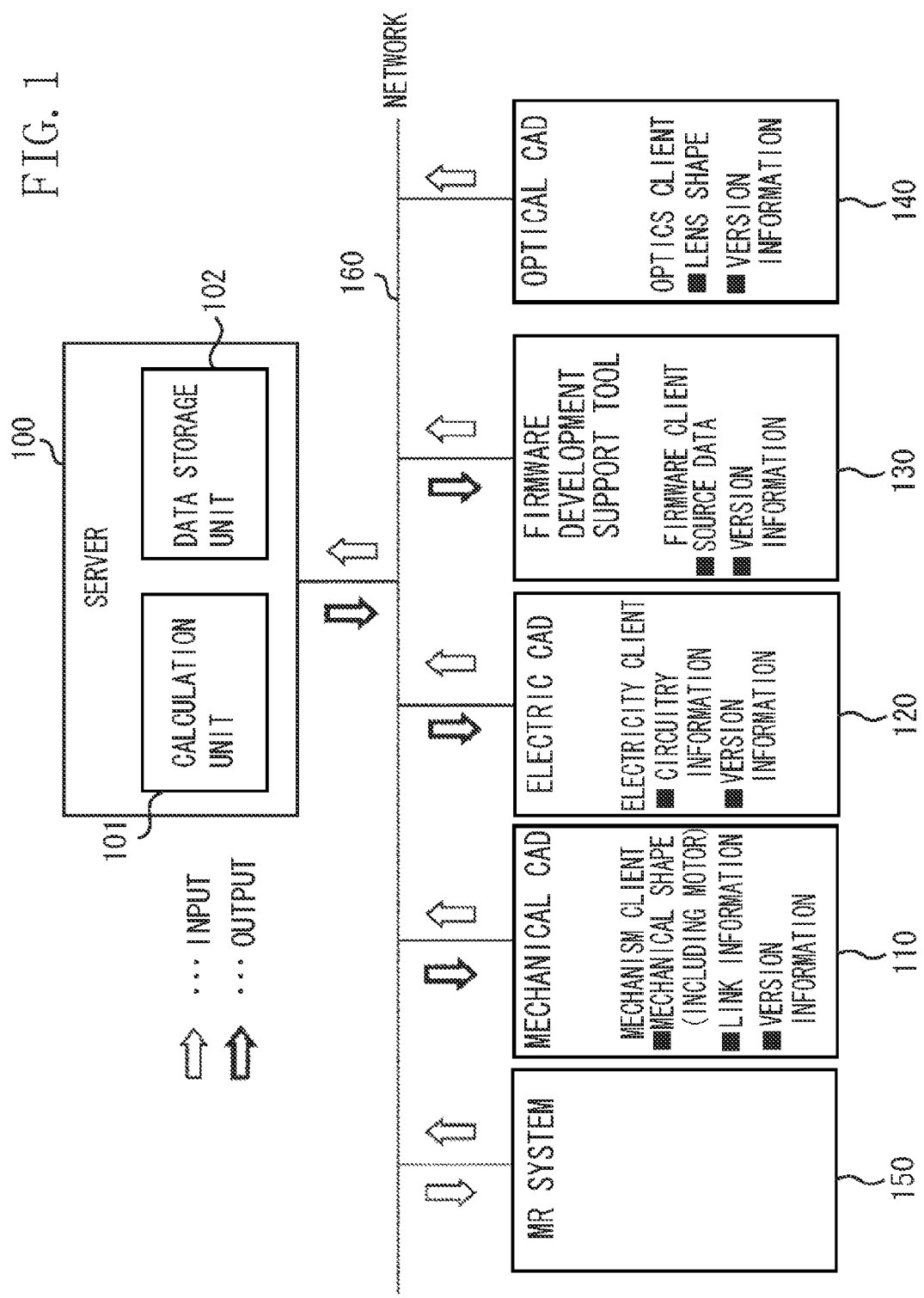
FIG. 1 illustrates a basic configuration of a three-dimensional CAD system according to an exemplary embodiment of the present invention.

FIG. 1 illustrates a basic configuration of a three-dimensional CAD system according to an exemplary embodiment of the present invention. A server 100 constitutes a brain unit of the system. A mechanical CAD 110 is a client used to design a mechanism unit, which is apart of an apparatus. An electric CAD 120 is a client used to design an electrical circuit unit of the apparatus. A firmware development support tool 130 is a client used to develop and aid the development of a program (firmware) that controls the mechanism unit and the electrical circuit unit of the apparatus. An optical CAD 140 is a client used to design optical components including a lens unit. An MR system 150 has a providing function to combine an actually captured image (video image in a real space) with a CG image to display the combined image.

The server 100 and each of the clients 110 through 150 (the mechanical CAD 110, the electric CAD 120, the firmware development support tool 130, the optical CAD 140, and the MR system 150) are connected to each other via a network 160. Then, various types of data are transmitted between each of the clients 110 through 150 and the server 100, and also between individual clients 110 through 150 through the server 100.

The server 100 includes a calculation unit 101 and 1a data storage unit 102. The calculation unit 101 extracts necessary data from the data storage unit 102, stores data, and performs calculation processing on the data in response to a request from each of the clients 110 through 150. Further, the calculation unit 101 generates a three-dimensional model of an apparatus to be designed, generates data for simulating various movements of the apparatus, and stores the data in the data storage unit 102 or causes the data to be downloaded to each of the clients 110 through 150.

The configuration of each of the clients 110 through 150 is described below. The mechanical CAD 110 builds up a mechanical design environment according to, for example, shape and operation data of mechanism parts to be used in design and an application for designing the mechanism unit by combining those mechanism parts. In a similar manner, the electric CAD 120 builds up a circuit designing environment according to, for example, data about various circuit parts, a circuit configuration, a circuit diagram, and various movement parameters with respect to the electrical circuit of the apparatus and an application that designs a circuit based on those data. The optical CAD 140 builds up an optical designing environment according to data about an optical configuration of the lens unit such as a lens shape and an optical characteristics, and an application that optically designs, for example, the lens unit based on those data.

The firmware development support tool 130 includes a firmware, i.e., a program, which controls movements of a mechanism unit, an electric circuit, an optical mechanism unit of the apparatus. The firmware development support tool 130 is configured to, as it will be described later, share the latest data or the designing environment of each of the other clients (the mechanical CAD 110, the electric CAD 120, and the optical CAD 140), thereby performing a movement simulation in real time. The MR system 150 superimposes the three-dimensional models having been formed within the server 100 on the video image in the real space and displays the thus combined image.

With the above described system, according to the design to be executed in each of the clients 110 through 150, data required for the design is read out from the data storage unit 102 of the server 100 and is then supplied to each of the clients 110 through 150. On the other hand, the designing operation performed by each of the clients 110 through 150 is uploaded to the calculation unit 101 of the server 100 in real time to generate a three-dimensional model of the apparatus (mechanism unit) within the server 100. Data of the three-dimensional model is stored in the data storage unit 102 and further is downloaded to a client as a request source in response to a request from each of the clients 110 through 150. The client as the request source can display the thus downloaded three-dimensional model after reflecting its designing data onto the thus downloaded three-dimensional model, as required, and can perform a simulation with the three-dimensional model.

Figure 2:
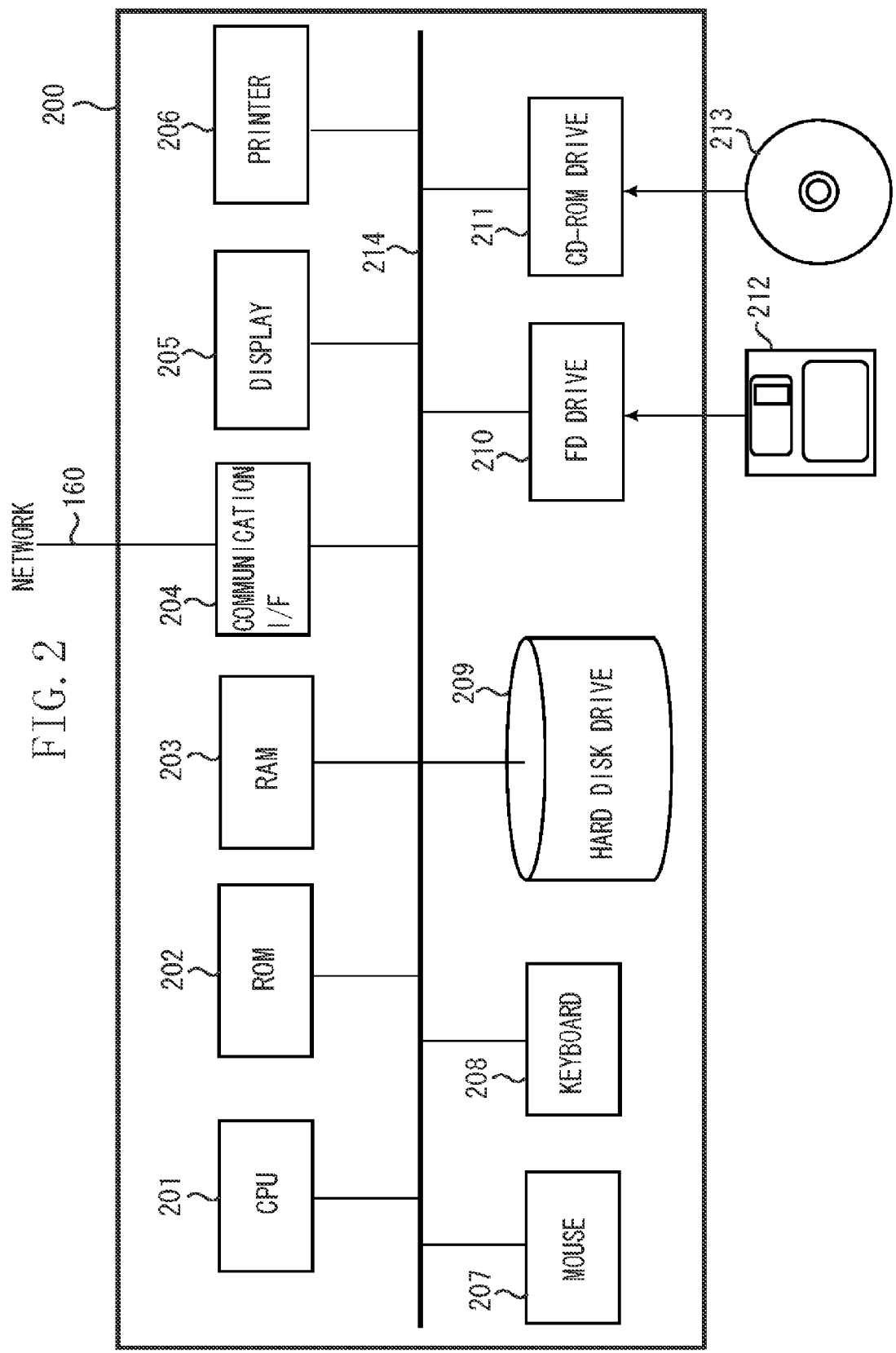
FIG. 2 is a block diagram illustrating a hardware configuration of each of clients of the three-dimensional CAD system.

FIG. 2 is a block diagram illustrating an example of a hardware configuration of each of the clients 110 through 150 in the three-dimensional CAD system according to the present exemplary embodiment.

Each of the clients 110 through 150 can be a general-purpose computer 200. The computer 200 includes a central processing unit (CPU) 201 as a control unit of the computer 200, and a read-only memory (ROM) 202, which stores a boot program executed by the CPU 201 when starting up the computer 200 and various programs running on hardware of the computer 200. A RAM 203 stores a program executed by the CPU 201 and data to be used by the CPU 201 for calculation. A communication interface (I/F) 204 makes a communication with the server 100 via the network 160. The computer 200 further includes a display 205, a printer 206, a mouse 207, a keyboard 208, a hard disk drive 209, a floppy disk (FD) drive 210, and a compact disc read-only memory (CD-ROM) drive 211.

The application program, the operating system, and the others, which cause the clients to work as the CAD, are stored in the hard disk drive 209.

The CPU 201 operates based on the program (which is loaded on the RAM 203 when being executed) stored in the ROM 202 or the hard disk drive 209 to control each unit within the computer 200. The communication I/F 204 makes communication with the other devices (with the clients or the server) via the network 160. The hard disk drive 209 stores a program and data for realizing a function that the computer 200 provides to the users, and provides the program and data to the CPU 201 through the RAM 203. The FD drive 210 and the CD-ROM drive 211 read the program and data from a removable medium, such as an FD 212 or a CD-ROM 213, and supply the thus read program and data to the RAM 203. An internal bus 214 connects the devices within the computer 200 to each other.

If the program executed by the CPU 201 is modified so as to realize a function of the server 100, the function of the server 100 also can be realized by the computer 200 illustrated in FIG. 2.

Figure 3:
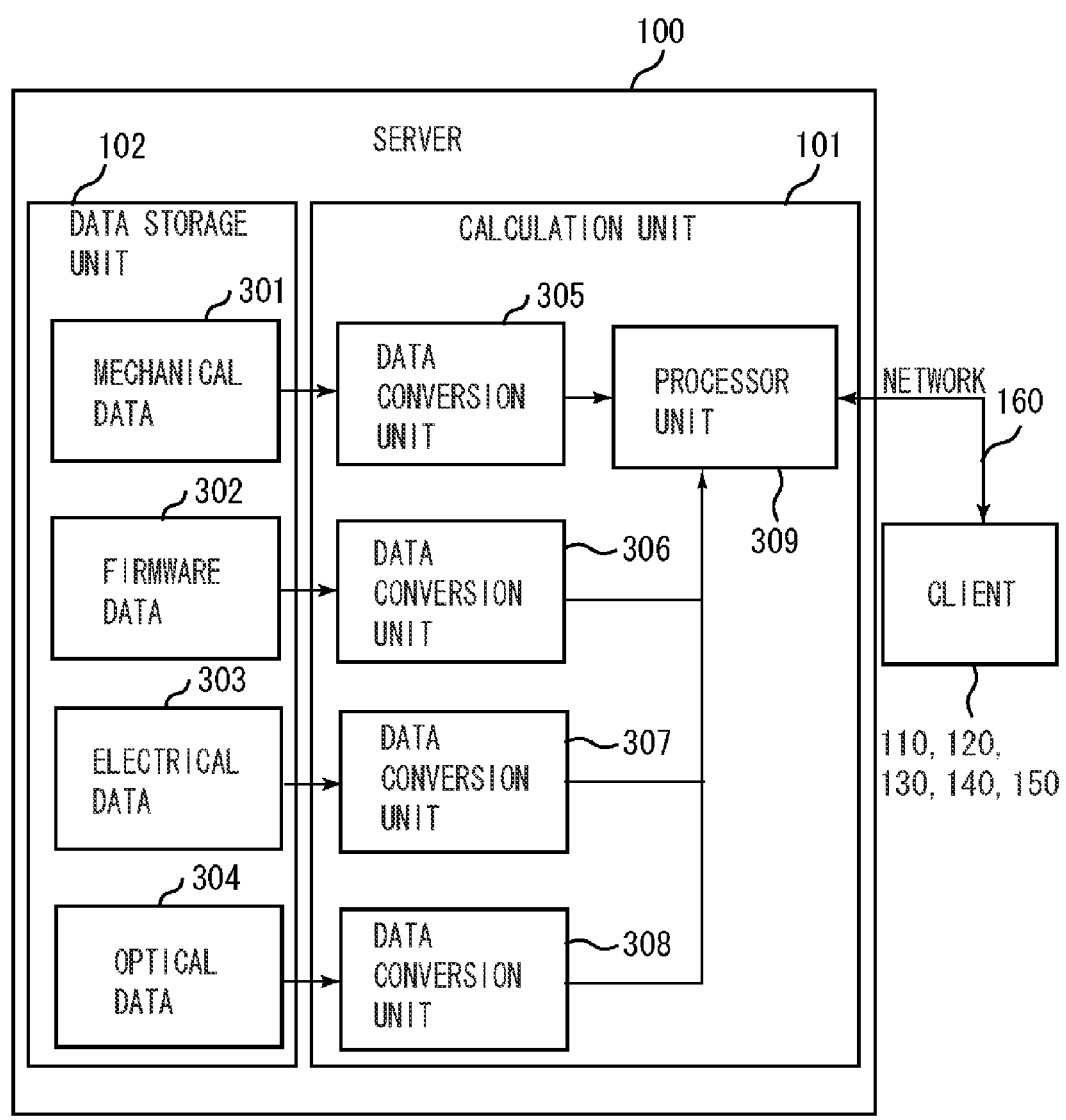
FIG. 3 is a block diagram illustrating a configuration of a server.

FIG. 3 is a block diagram illustrating an example of a functional configuration of the server 100.

The server 100 includes the calculation unit 101 and the data storage unit 102. The data storage unit 102 is implemented by a storage device, e.g., the hard disk drive 209. The data storage unit 102 stores and accumulates mechanical data 301, electrical data 303, optical data 304, and firmware data 302, which correspond to the mechanical CAD 110, the electric CAD 120, the optical CAD 140, the firmware development support tool 130, and the MR system 150, respectively, serving as clients.

For example, the mechanical data 301 corresponding to the mechanical CAD 110 contains data of various mechanical parts required for the mechanical design, data of configurations of active components such as an actuator or a motor, a size, a shape, and the other various characteristics. Further, the mechanical data 301 corresponding to the mechanical CAD 110 contains mechanism model data designed in the mechanical CAD 110 of the client. Still further, the mechanical data 301 corresponding to the mechanical CAD 110 manages a shape, an attribute, or the like of the parts registered, and sends data required by the calculation unit 101 in response to a request from the processor unit 309. Similar processing is performed in each of the electrical data 303, the optical data 304, and the firmware data 302. More specifically, the electrical data 303 contains data about the parts of the electrical circuit and electrical circuit data designed by the electric CAD 120. The optical data 304 contains data of the optical parts and optical design data designed by the optical CAD 140. The firmware data 302 contains firmware data generated by the firmware development support tool 130.

The calculation unit 101, which is implemented by, for example, the CPU 201, includes a data conversion unit 305 for mechanical data, a data conversion unit 306 for firmware data, a data conversion unit 307 for electrical data, and a data conversion unit 308 for optical data. Further, the processor unit 309 performs calculation processing on the data converted by the data conversion units 305 through 308 based on the program. The data conversion units 305 through 308 read out the mechanical data 301, the electrical data 303, the optical data 304, and the firmware data 302 from the data storage unit 102, respectively, based on an instruction from each of the clients. Then, for example, in the mechanical design, the mechanical data is converted in accordance with the designing environment of the client as the request source. More specifically, the registered parts-data read out from the mechanical data 301 is converted with respect to a display scale, mounting positions of the parts to the device, orientation of the device, or the like in accordance with characteristics and specification which can be handled by the client and are preliminary registered. In a case where the mechanical CAD 110 is the client as the request source, the data conversion is not essential for the client as the request source. Accordingly, the design data can be shared between the different CAD systems. The converted data is sent to the processor unit 309 to be further provided to the client as the request source.

Similarly, the electrical data 303 is read out in accordance with an instruction from each of the clients 110 through 140. Then, the electrical data 303 is converted into such a certain data form in the data conversion unit 307 that the electrical data 303 can be managed by the client as the request source, and thereafter the converted data is supplied to the client as the request source through the processor unit 309.

In a similar manner, each of the other optical data 304 and the firmware data 302 is converted into a certain form in compliance with a request from each of the clients as the request source, and thereafter the respective converted data is supplied to each client through the processor unit 309.

In other words, a request signal generated by the mechanical CAD 110 as the client is supplied to the processor unit 309 within the calculation unit 101 of the server 100 via the network 160. The processor unit 309 requests essential data from the data storage unit 102 based on the request signal and the program stored in the RAM 203 or the hard disk 209. The data storage unit 102 reads out the requested data 301, 302, 303, and 304, and thereafter sends them to the respective corresponding data conversion units 305, 306, 307, and 308.

Each of the data conversion units 305 through 308 converts data based on a data conversion program stored in the RAM 203 or the hard disk 209, and thereafter sends the converted data to the processor unit 309. The processor unit 309 performs calculation for a simulation or the like with the converted data provided by the processor unit 309, and thereafter sends the calculation result to the mechanical CAD 110, i.e., the client as the request source, via the network 160. The mechanical CAD 110 displays the calculation result on the display 205 and stores the calculation result in the hard disk 209 in the form of a file. The above described flow is common to all of the clients 110, 120, 130, and 140.

Figure 4:
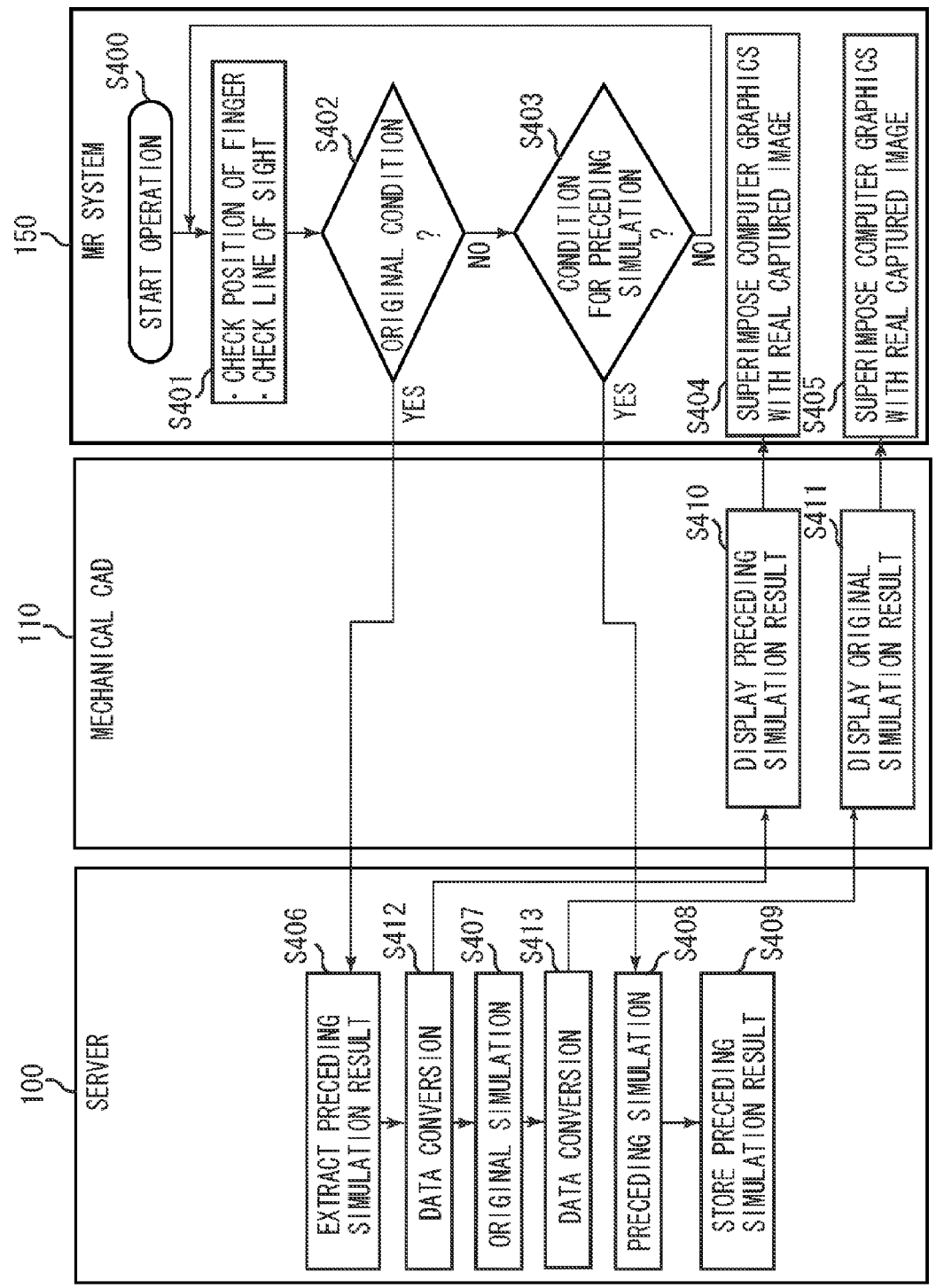
FIG. 4 illustrates flows of commands and data among a mixed reality (MR) system, a mechanical CAD, and a server according to a first exemplary embodiment of the present invention.

FIG. 4 illustrates a flow of commands and data between the client as the request source and the server 100.

In FIG. 4, an example is illustrated in which the MR system 150 is the client as the request source. FIG. 4 illustrates an actual bi-directional flow of various types of data transmitted between the server 100 and the MR system 150 and how to manage the data. Further, FIG. 4 illustrates processing of various operations and transmission and reception of data when the mechanism designer (the user of the MR system 150) designs the mechanism unit by using the three-dimensional CAD system of the present exemplary embodiment. In FIG. 4, the processing flow proceeds top-to-bottom. Each processing can be performed at the same time.

In step S400, the mechanism designer starts up the MR system 150, and observes a model, which the mechanism designer is designing in the mechanical CAD 110, on the MR space while superimposing the model on the actually captured image. In the present exemplary embodiment, a camera is used as the model as illustrated in FIG. 5.

Figure 5:
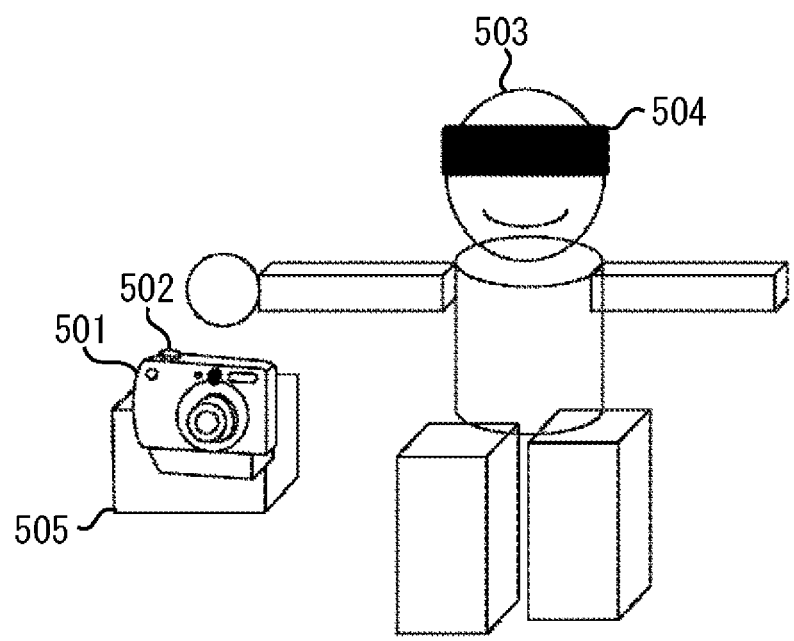
FIG. 5 illustrates a user operating a virtual camera.

FIG. 5 illustrates the MR space. The camera 501 is the computer graphics drawn by the mechanical CAD 110 based on a point of view of the mechanism designer. In the camera 501, a displayed position and orientation moves in conjunction with the state of a position and orientation of a mock-up 505 having a shape of a camera with a position and orientation sensor. The position and orientation of the mock-up 505 is measured by an object position and orientation measurement unit 607 mounted on a head mounted display (HMD) 504. The camera 501 includes a shutter button 502, which moves in conjunction with a shutter button of the mock-up 505. A user 503 wears the HMD 504 to operate the camera 501.

Figure 6:
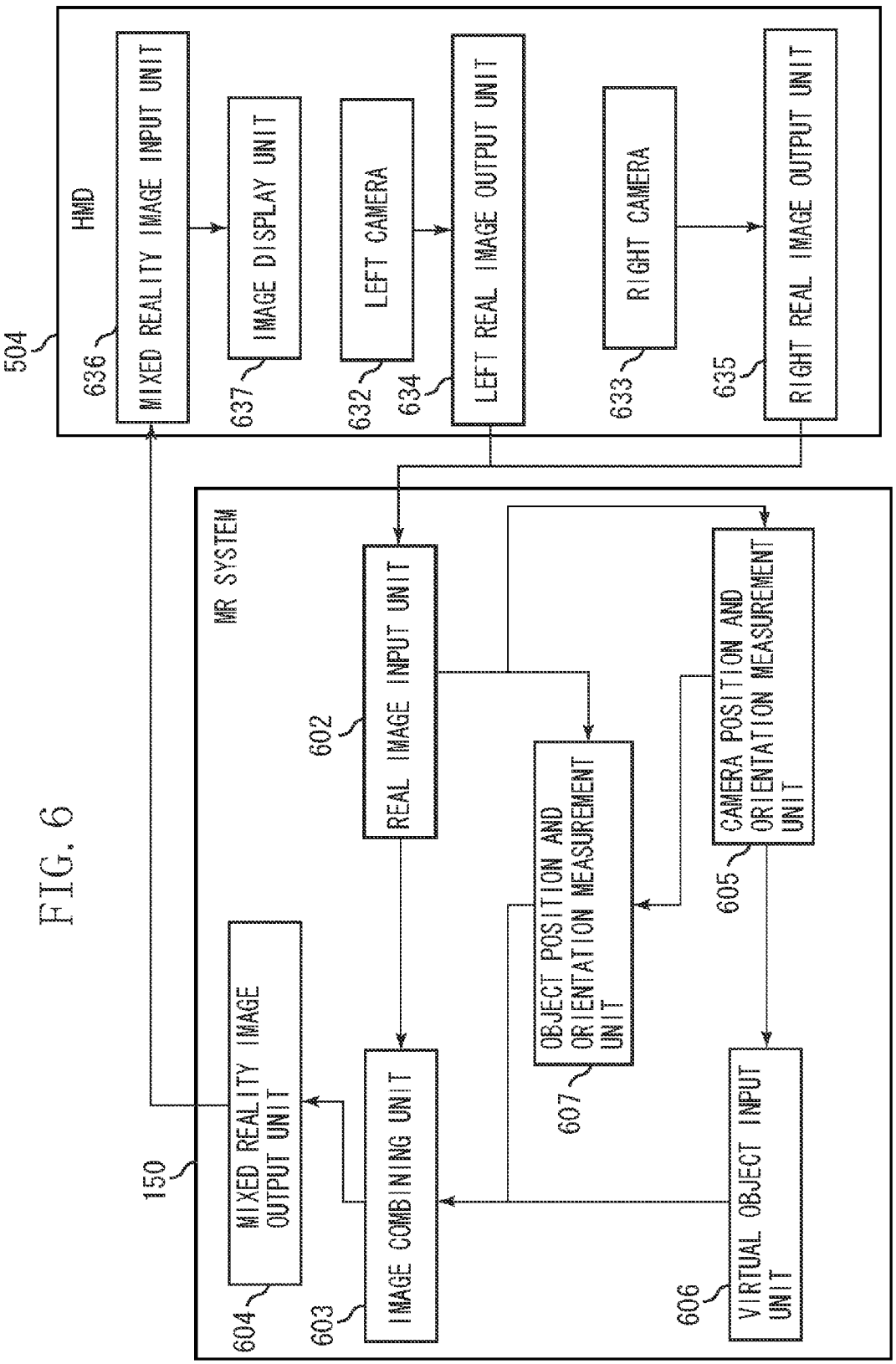
FIG. 6 illustrates a detailed configuration of the MR system.

FIG. 6 illustrates configurations of the HMD 504 and the MR system 150. The MR system 150 includes a real image input unit 602, an image combining unit 603, a mixed reality image output unit 604, a camera position and orientation measurement unit 605, a virtual object input unit 606, and an object position and orientation measurement unit 607.

The HMD 504 includes a left camera 632, a right camera 633, a left real image output unit 634, a right real image output unit 635, a mixed reality image input unit 636, and an image display unit 637.

Referring back to FIG. 5, movements of the user 503 are described below. A position and orientation sensor is connected to a finger of the user 503. The user 503 holds the mock-up 505 to operate the camera 501. The user 503 is about to push the shutter button 502 of the camera 501.

The finger of the user 503 gradually approaches the shutter button 502. Naturally, a simulation that the user 503 pushes the shutter button 502 of the camera 501 starts when the finger of the user 503 reaches the position at which the user 503 pushes the shutter button 502.

However, it takes time for the simulation if the simulation is started after the finger of the user 503 actually reaches the above position. Therefore, computer graphics as a result of the push immediately after the user 503 pushes the shutter button 502 may not be obtainable. An actual simulation is performed before the finger of the user 503 actually reaches the shutter button 502, and the result of the actual simulation is stored. Referring back to FIG. 4, the above flow is described below with reference to the flow chart of FIG. 4.

In step S400, after the MR system 150 has started, then in step S401, the position and orientation sensor measures the position of the finger of the user 503. In step S402, the MR system 150 determines whether the finger of the user 503 is located at a predetermined position where the shutter button 502 is pushed. If the finger of the user 503 is located at the predetermined position (YES in step S402), the processing proceeds to step S406. If the finger of the user 503 is not located at the predetermined position (NO in step S402), the processing proceeds to step S403.

In step S403, the MR system 150 determines whether the position of the finger of the user 503 is about to reach the predetermined position although not yet reaching the predetermined position. If the MR system 150 determines that the finger of the user 503 is almost about to reach the predetermined position (YES in step S403), the processing proceeds to step S408.

In step S408, the server 100 performs a simulation corresponding to the case where the finger of the user 503 has reached the predetermined position. In step S409, the server 100 stores the simulation result of step S408 in the data storage unit 102.

In step S406, the server 100 extracts a preceding simulation result from the data storage unit 102. In step S412, the server 100 converts the preceding simulation result into data for the mechanical CAD 110 and then transmits the thus-converted data to the mechanical CAD 110. Then, in the server 100, the processing proceeds to step S407. In the mechanical CAD 110, the processing proceeds to step S410. In step S410, the mechanical CAD 110 obtains the preceding simulation result from the server 100 and displays the obtained preceding simulation result. In step S404, the MR system 150 superimposes computer graphics displayed in step S410 on the actually captured image to display the combined image.

In step S407, the server 100 performs an original simulation. In step S413, the server 100 converts the original simulation into data for the mechanical CAD 110 and transmits the data to the mechanical CAD 110. In step S411, the mechanical CAD 110 obtains the original simulation result from the server 100 and displays the obtained original simulation result. In step S405, the MR system 150 superimposes computer graphics displayed in step S411 on the actually captured image to display the combined image.

As described above, the three-dimensional CAD system predicts an environment of the real space according to the position of the finger of the user 503 and determines a preceding simulation, so that the user 503 can have an experience with the MR space without experiencing any delay.

A second exemplary embodiment of the present invention has a similar basic configuration to that of the first exemplary embodiment. A difference between the second exemplary embodiment and the first exemplary embodiment is a condition for starting a simulation. In the first exemplary embodiment, the MR system 150 starts a simulation in the server 100. However, in the second exemplary embodiment, the mechanical CAD 110 starts a simulation in the server 100.

Figure 7:
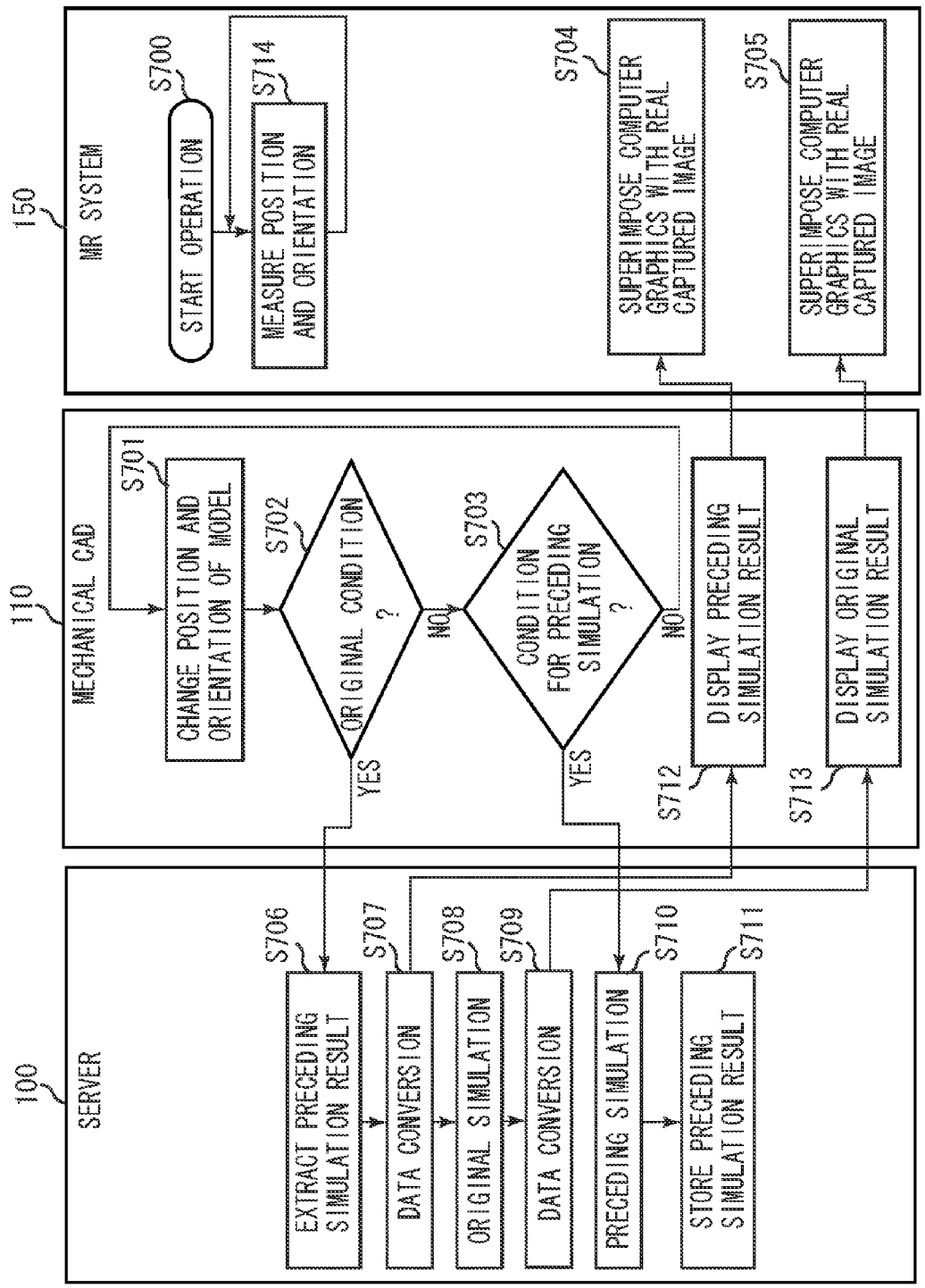
FIG. 7 illustrates flows of commands and data among the MR system, the mechanical CAD, and the server according to a second exemplary embodiment of the present invention.

Processing performed according to the second exemplary embodiment is described below with reference to the flow chart of FIG. 7. In step S700, the MR system 150 starts its operation. In step S714, the MR system 150 measures a position and orientation of the mock-up 505 and sends the measure value to the mechanical CAD 110.

In step S701, the mechanical CAD 110 receives the measured value about the position and orientation of the mock-up 505 from the MR system 150 and sets the measured value to the camera 501 with respect to the position and orientation of the camera 501. In step S702, if the mechanical CAD 110 is under the condition to perform an original simulation (YES in step S702), the processing proceeds to step S706. If the mechanical CAD 110 is not under the condition to perform an original simulation (NO in step S702), the processing proceeds to step S703.

In step S703, the mechanical CAD 110 determines whether the mechanical CAD 110 is under the condition to perform a preceding simulation. The condition to perform a preceding simulation (order of the simulation) can be set, for example, such that a time period to be taken in the processing becomes the minimum. If the mechanical CAD 110 determines that the mechanical CAD 110 is under the condition to perform a preceding simulation (YES in step S703), the processing proceeds to step S710. If the mechanical CAD 110 determines that the mechanical CAD 110 is not under the condition to perform a preceding simulation (NO in step S703), the processing proceeds to step S701.

In step S710, the server 100 starts the preceding simulation. With the above described processing, the order to perform the simulation is changed, resulting in preventing the simulation from delaying.

In step S711, the server 100 causes the data storage unit 102 to store the result of the preceding simulation.

In step S706, the server 100 extracts the result of the preceding simulation from the data storage unit 102. In step S707, the server 100 converts the result of the preceding simulation into data for the mechanical CAD 110, and then the processing proceeds to step S708. At the same time, the processing also proceeds to step S712, in which the mechanical CAD 110 receives the result of the preceding simulation and displays the result. Then, the processing proceeds to step S704, in which the MR system 150 combines the actually captured image with the computer graphics displayed in step S712 and displays the thus-combined image.

In step S708, the server 100 performs the simulation under the present condition. In step S709, the server 100 converts the result of the simulation into data for the mechanical CAD 110 and sends the data to the mechanical CAD 110, and then the processing proceeds to step S713. In step S713, the mechanical CAD 110 receives the result of the original simulation and displays the result. In step S705, the MR system 150 combines the actually captured image with the computer graphics displayed in step S713 and displays the combined image.

A basic configuration of a third exemplary embodiment of the present invention is similar to that of the first exemplary embodiment. The third exemplary embodiment is different from the first exemplary embodiment in a control method performed when the simulation delays. In the first exemplary embodiment and the second exemplary embodiment, the delay of a simulation is covered by performing a preceding simulation. In the third exemplary embodiment, a simple simulation method capable of performing high-speed processing without delay, although incapable of performing a high-accuracy simulation, is prepared to avoid the delay of a simulation.

Figure 8:
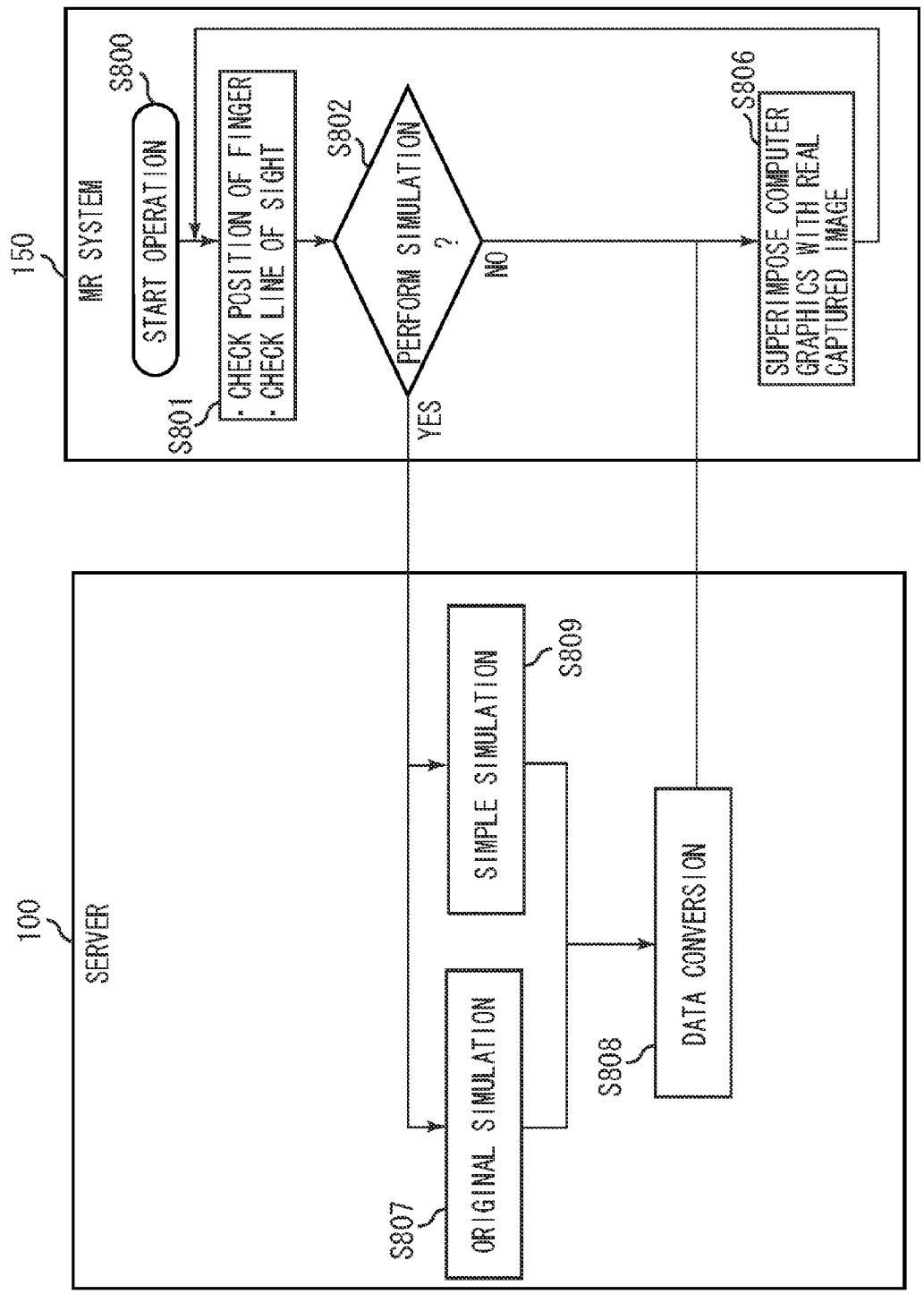
FIG. 8 illustrates flows of commends and data between the MR system and the server according to a third exemplary embodiment of the present invention.

Processing performed according to the third exemplary embodiment is described below with reference to the flow chart of FIG. 8. In step S800, the MR system 150 starts its operation. In step S801, the MR system 150 checks the movement of the user 503. In step S802, the MR system 150 determines whether to perform a simulation. If the MR system 150 determines to perform a simulation (YES in step S802), the processing proceeds to step S807 and step S809. Steps S807 and step S809 are concurrently performed. In step S807, the server 100 performs an original simulation. In step S809, the server 100 performs a simple simulation without delaying. In step S808, if processing in step S807 has been completed, the server 100 converts the result of processing in step S807 into data and sends the data to the MR system 150. Further, if the processing in step S807 has not been completed, the server 100 converts the result of processing in step S809 into data and sends the data to the MR system 150.

In step S806, the MR system 150 draws a simulation result and combines the simulation result with the real captured image to display the combined image. Then, the processing proceeds to step S801.

As described above, a designing environment in which an MR system, a mechanical CAD, an electric CAD, a software tool, and an optical CAD are well combined can be realized to perform a mutual simulation. As a result, a complete simulation can be performed even before a trial model is assembled. Further, the user 503 can sensuously check the movement of the trial model. Thus, a development design environment is dramatically developed and the number of simulated designs and the number of trial models can be reduced, resulting in dramatically reducing a development design cost.

Further, according to an exemplary embodiment of the present invention, in a three-dimensional CAD system including a server, an MR system, and a plurality of clients, each of the clients can share design data made by the respective clients. In other words, a simulation can be performed by combining elements, for example, a mechanism, an electrical circuit, software, and optical parts, which are individually designed by each of the clients. Therefore, a perfect simulation can be performed even before the trial model is assembled and thus the development design environment is dramatically improved. As a result, the number of simulated designs and the number of trial models can be reduced, thereby dramatically reducing the development design cost. Further, a designed object can be simulated while the object is still in the developmental stage. Still further, since the movement of the designed object can be sensuously checked in three dimensions, parallel designing with the other designers, collaborative study with the other designers, and reduction of mistakes in specification can be achieved.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. An apparatus communicable with a plurality of client devices, the apparatus comprising:
   a storing unit configured to store a three-dimensional model and information that identifies a target position of a predetermined part of a user;
   a receiving unit configured to receive a request from at least one of a plurality of client devices and receive a measured position of the predetermined part of the user from a measuring unit that is configured to measure the position of the predetermined part of the user and that is included in the at least one of the plurality of client devices;
   a calculation unit configured to, in a case where the measured position of the predetermined part of the user is not the target position and is within a predetermined range of the target position, generate a representation of a movement of the three-dimensional model that corresponds to the target position and store the representation of the movement of the three-dimensional model that corresponds to the target position in a storage device;
   an obtaining unit configured to, in a case where the measured position of the predetermined part of the user is the target position after the calculation unit has stored the representation of the movement of the three-dimensional model that corresponds to the target position, obtain the stored representation of the movement of the three-dimensional model that corresponds to the target position; and
   a transmission unit configured to transmit the obtained representation of the movement of the three-dimensional model that corresponds to the target position to the at least one of the plurality of client devices for synthesis processing to be performed by a synthesizing unit included in the at least one of the plurality of client devices.

2. The apparatus according to claim 1, wherein the three-dimensional model is a CAD model.

3. The apparatus according to claim 1, wherein the at least one of the plurality of client devices is an electric CAD, a mechanical CAD, an optical CAD, or a firmware development support tool.

4. A method comprising:
   storing a three-dimensional model and information that identifies a target position of a predetermined part of a user in a storage unit;
   receiving a request from at least one of a plurality of client devices and receiving a first measured position of the predetermined part of the user from a measuring unit that is configured to measure the position of the predetermined part of the user and that is included in the at least one of the plurality of client devices;
   in a case where the first measured position of the predetermined part of the user is not the target position and is within a predetermined range of the target position,
      generating a representation of a movement of the three-dimensional model that corresponds to the target position, and
      storing the representation of the movement of the three-dimensional model that corresponds to the target position in a storage device;
   receiving a second measured position of the predetermined part of the user from a measuring unit that is configured to measure the position of the predetermined part of the user and that is included in at least one of the plurality of client devices;
   obtaining, in a case where the second measured position of the predetermined part of the user is the target position after the storing of the representation of the movement of the three-dimensional model that corresponds to the target position, the stored representation of the movement of the three-dimensional model that corresponds to the target position; and
   transmitting the obtained representation of the movement of the three-dimensional model that corresponds to the target position to at least one of the plurality of client devices for synthesis processing to be performed by a synthesizing unit included in the at least one of the plurality of client devices.

5. A non-transitory computer-readable recording medium storing a computer-executable program which, when executed by a computer, causes the computer to carry out the method according to claim 4.

6. An apparatus comprising:
   a storing unit configured to store a three-dimensional model;
   a measuring unit configured to measure a position of the predetermined part of the user, thereby generating a measured position of the predetermined part of the user;
   calculation unit configured to generate a first representation of a movement of the three-dimensional model and generate a second representation of the movement of the three-dimensional model based on the measured position and store the first representation of the movement and the second representation of the movement in a storing device, wherein generating the first representation of the movement takes more time than generating the second representation of the movement;
   a synthesizing unit configured to synthesize an image that represents one of the first representation of the movement and the second representation of the movement with a real space image, thereby generating a synthesized image, wherein the synthesizing unit is configured to synthesize an image that represents the first representation of the movement with the real space image in a case where the generation of the first representation of the movement has been finished, and to synthesize an image that represents the second representation of the movement with the real space image in a case where the generation of the first representation of the movement has not been finished; and
   an output unit configured to output the synthesized image.

7. The apparatus according to claim 6, wherein the first representation of the movement of the three-dimensional model is more accurate than the second representation of the movement.

8. The apparatus according to claim 6, wherein the calculation unit is configured to generate the first representation of the movement of the three-dimensional model and the second representation of the movement of the three-dimensional model in a case where the measured position satisfies a predetermined condition.

9. The apparatus according to claim 6, wherein the three-dimensional model is a CAD model.

10. The apparatus according to claim 6, further comprising:
a display unit configured to display the synthesized image.

11. The apparatus according to claim 10, wherein the display unit is a head mounted display.

12. The apparatus according to claim 6, wherein the position of the predetermined part of the user is measurable by a sensor mounted on the user.

13. A method comprising:
storing a three-dimensional model;
measuring a position of a predetermined part of a user, thereby generating a measured position of the predetermined part of the user;
generating a first representation of a movement of the three-dimensional model and a second representation of the movement of the three-dimensional model based on the measured position and storing the first representation of the movement and the second representation of the movement in a storing device, wherein generating the first representation of the movement takes more time than generating the second representation of the movement;
synthesizing an image that represents one of the first representation of the movement and the second representation of the movement with a real space image, thereby generating a synthesized image, wherein an image that represents the first representation of the movement is synthesized with the real space image in a case where the generating of the first representation of the movement has been finished, and an image that represents the second representation of the movement is synthesized with the real space image in a case where the generating of the first representation of the movement has not been finished; and
outputting the synthesized image.

14. One or more non-transitory computer-readable media storing instructions that, when executed by one or more computing devices, cause the one or more computing devices to perform operations comprising:
storing a three-dimensional model;
measuring a position of a predetermined part of a user, thereby generating a measured position of the predetermined part of the user;
generating a first representation of a movement of the three-dimensional model and a second representation of the movement of the three-dimensional model based on the measured position and storing the first representation of the movement and the second representation of the movement in a storing device, wherein generating the first representation of the movement takes more time than generating the second representation of the movement;
synthesizing an image that represents one of the first representation of the movement and the second representation of the movement with a real space image, thereby generating a synthesized image, wherein an image that represents the first representation of the movement is synthesized with the real space image in a case where the generating of the first representation of the movement has been finished, and an image that represents the second representation of the movement is synthesized with the real space image in a case where the generating of the first representation of the movement has not been finished; and
outputting the synthesized image.

* * * * *